(12) United States Patent
Shibuya et al.

(10) Patent No.: US 9,349,694 B2
(45) Date of Patent: May 24, 2016

(54) METHOD OF MANUFACTURING A SEMICONDUCTOR DEVICE

(71) Applicant: KABUSHIKI KAISHA TOSHIBA, Tokyo (JP)

(72) Inventors: Katsunori Shibuya, Miegun Kawgoe Mie (JP); Soichi Homma, Yokkaichi Mie (JP); Yuusuke Takano, Yokkaichi Mie (JP); Shinpei Ishida, Tsushima Aichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,053

(22) Filed: Aug. 29, 2014

(65) Prior Publication Data

US 2015/0171019 A1  Jun. 18, 2015

(30) Foreign Application Priority Data

Dec. 13, 2013  (JP) .................................. 2013-258655

(51) Int. Cl.
*H01L 21/00* (2006.01)
*H01L 23/552* (2006.01)
(Continued)

(52) U.S. Cl.
CPC ............. *H01L 23/552* (2013.01); *H01L 21/78* (2013.01); *H01L 23/3121* (2013.01); *H01L 24/97* (2013.01); *H01L 25/0655* (2013.01); *H01L 25/0657* (2013.01); *H01L 25/50* (2013.01); *H01L 21/561* (2013.01); *H01L 2224/32145* (2013.01); *H01L 2224/32225* (2013.01); *H01L 2224/45147* (2013.01); *H01L 2224/48091* (2013.01); *H01L 2224/48145* (2013.01); *H01L 2224/48227* (2013.01); *H01L 2224/73265* (2013.01); *H01L 2224/92247* (2013.01); *H01L 2224/97* (2013.01); *H01L 2225/0651* (2013.01); *H01L 2225/06506* (2013.01); *H01L 2225/06562* (2013.01); *H01L 2924/181* (2013.01)

(58) Field of Classification Search
CPC ....... H01L 23/552; H01L 23/31; H01L 21/78; H01L 21/561; H01L 25/50; H01L 25/0655; H01L 25/0657; H01L 24/97; H01L 2224/92247; H01L 2224/32145; H01L 2224/32225; H01L 2224/48091; H01L 2224/48145; H01L 2224/73265; H01L 2224/48227; H01L 2924/00; H01L 2924/00014; H01L 2225/06506; H01L 2225/0651; H01L 2225/06562; H01L 2224/97; H01L 2224/45147
See application file for complete search history.

(56) References Cited

U.S. PATENT DOCUMENTS

2001/0011772 A1  8/2001  Fukasawa et al.

FOREIGN PATENT DOCUMENTS

JP  2001085596  3/2001
JP  2009-200175  * 9/2009  .............. H01L 23/12
(Continued)

OTHER PUBLICATIONS

Taiwan Office Action dated Oct. 23, 2015, filed in Taiwan counterpart Application No. 103123685, 8 pages (with translation).

*Primary Examiner* — Nikolay Yushin
(74) *Attorney, Agent, or Firm* — Patterson & Sheridan, LLP

(57) ABSTRACT

According to one embodiment, a semiconductor device includes a substrate. A semiconductor chip is disposed on a first surface of the substrate. The semiconductor chip is covered with a sealing material. A front surface and a side surface of the sealing material are covered with a conductive film. On an outer edge of a substrate-side of the semiconductor device, a step or a trench is formed.

5 Claims, 10 Drawing Sheets

(51) Int. Cl.
*H01L 21/78* (2006.01)
*H01L 25/00* (2006.01)
*H01L 25/065* (2006.01)
*H01L 23/00* (2006.01)
*H01L 23/31* (2006.01)
*H01L 21/56* (2006.01)

(56) References Cited

FOREIGN PATENT DOCUMENTS

| | | |
|---|---|---|
| JP | 2012-039104 A | 2/2012 |
| JP | 2012023158 | 2/2012 |
| TW | I333687 B | 11/2010 |

* cited by examiner (A)

(B)

METHOD OF MANUFACTURING A SEMICONDUCTOR DEVICE

CROSS-REFERENCE TO RELATED APPLICATION

This application is based upon and claims the benefit of priority from Japanese Patent Application No. 2013-258655, filed Dec. 13, 2013, the entire contents of which are incorporated herein by reference.

FIELD

Embodiments described herein relate generally to a semiconductor device and a method of manufacturing the semiconductor device.

BACKGROUND

To suppress electro magnetic interference (EMI) caused by semiconductor devices, electromagnetic shields may be formed on the surfaces of semiconductor packages. On the occasion of forming electromagnetic shields on semiconductor packages, the semiconductor packages are mounted on a conveyance carrier such that the rear surfaces (substrate-side surfaces) of the semiconductor packages face the conveyance carrier. When electromagnetic shield material is formed on the surfaces of the semiconductor packages, the electromagnetic shield material is also formed on the surface of the conveyance carrier between every neighboring two of the plurality of semiconductor packages. That is, the electromagnetic shield material is formed as a continuous film on the surfaces of the semiconductor packages and the surface of the conveyance carrier. In this case, after the electromagnetic shields are formed, when the semiconductor packages are detached from the conveyance carrier, electromagnetic shield material burrs form on the outer edges of the semiconductor packages.

DETAILED DESCRIPTION

Embodiments provide a semiconductor device, and a method of manufacturing the semiconductor device, wherein the creating of burrs of a shield material on the outer edge of a semiconductor package when an electromagnetic shield is formed on the surface of the semiconductor package is suppressed.

In general, according to one embodiment, a semiconductor device includes a substrate. A semiconductor chip is disposed on a first surface of the substrate. The semiconductor chip is covered with a sealing material. A front surface and a side surface of the sealing material are covered with a conductive film. On an outer edge of a substrate-side of the semiconductor device, a step or a trench is formed.

Hereinafter, embodiments of the present disclosure will be described with reference to the accompanying drawings. The embodiments do not limit the present disclosure. In the following embodiments, the upper and lower sides of a substrate mean relative directions in a case where a semiconductor chip mounting surface of the substrate faces upward, and may be different from the upper and lower sides based on gravitational acceleration.

First Embodiment

Figure 1A:
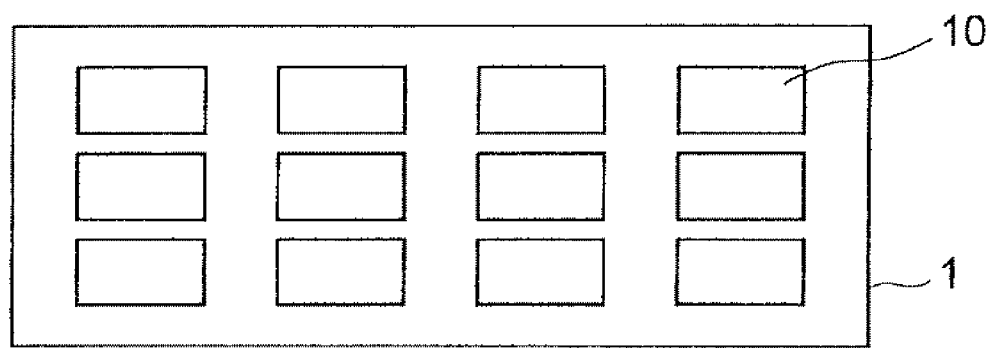
FIGS. 1A and 1B are views illustrating a state where a plurality of semiconductor devices according to a first embodiment is on a conveyance carrier.
Figure 1B:
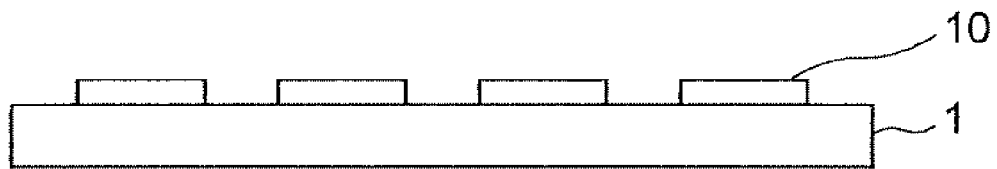

FIGS. 1A and 1B are views illustrating a state where a plurality of semiconductor devices 10 according to a first embodiment are located on a conveyance carrier 1. The semiconductor devices 10 (hereinafter, referred to as semiconductor packages) are mounted on the conveyance carrier 1, which is conveyed into a sputtering system. In the sputtering system, an electromagnetic shield material is formed on the surfaces of the semiconductor devices 10. The semiconductor devices 10 may be NAND memories; however, they are not especially limited. An electromagnetic shield layer forming method may also be electro or electroless plating, vapor deposition, or ion plating, rather than sputtering.

Figure 2A:
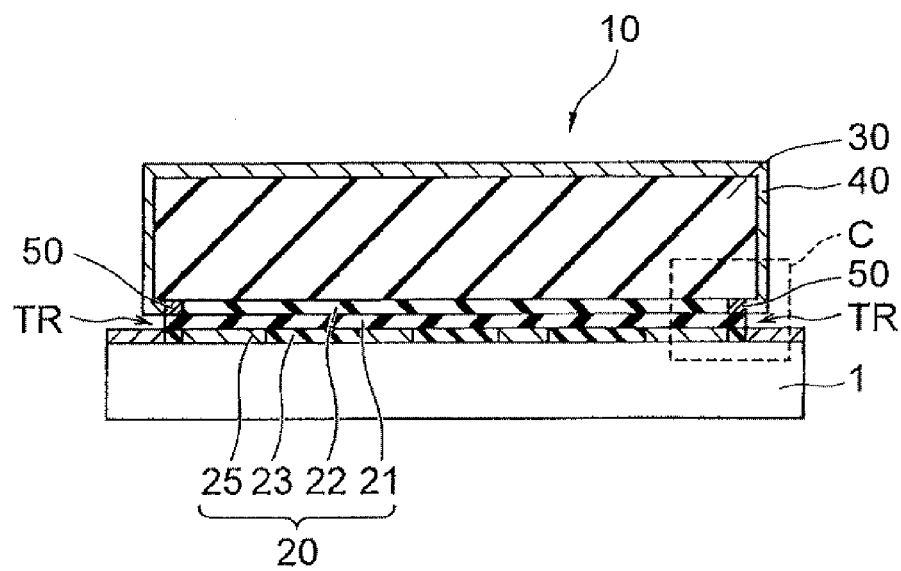
FIGS. 2A and 2B are cross-sectional views illustrating a state where an electromagnetic shield has been formed on the surface of the semiconductor device.
Figure 2B:
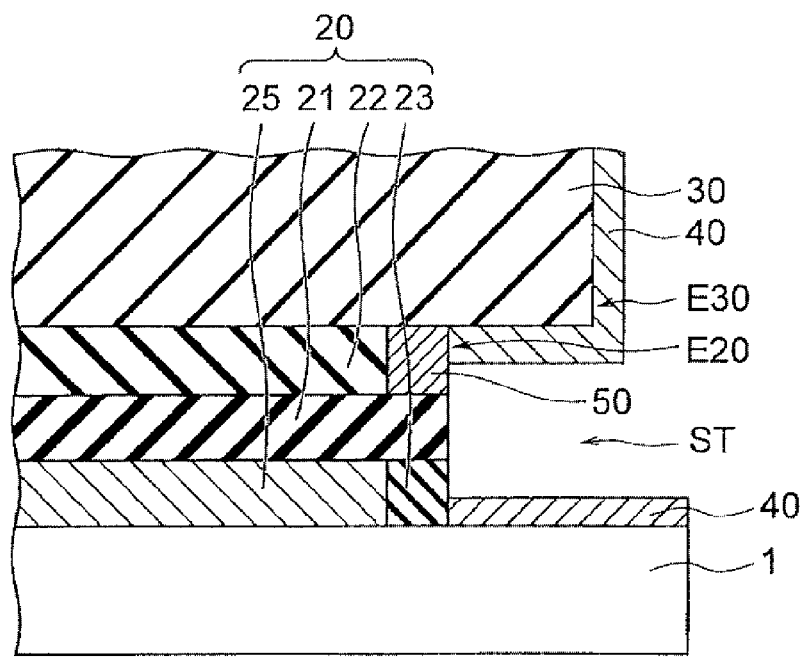

FIG. 2A is a cross-sectional view illustrating a state in which the semiconductor device 10 is located on the conveyance carrier 1, and an electromagnetic shield 40 has been formed on the surface of the semiconductor device 10. FIG. 2B is an enlarged view of a portion of FIG. 2A enclosed in broken lines C.

The semiconductor device 10 mounted on the conveyance carrier 1 includes a wiring substrate 20, a sealing material 30, and the electromagnetic shield 40. The wiring substrate 20 may be a printed wiring board (PWB) or the like. The wiring substrate 20 includes a core material 21, solder resist layers 22 and 23, terminals 25, and wiring lines (not illustrated). The core material 21 is formed of a material such as glass, a resin, Teflon® or ceramic. The solder resist layer 22 covers the upper surface (a first surface) of the core material 21 and the wiring lines, and the solder resist layer 23 covers the rear surface (a second surface which is on the opposite to the first surface) of the core material 21. The terminals 25 are provided on the rear surface of the core material 21. Also, the solder resist layer 23 is provided on the rear surface of the core material 21 except for the locations of the terminals 25.

The sealing material 30 is formed of, for example, a resin for molding. The sealing material 30 covers and protects one or more semiconductor chips disposed on the upper surface (a first surface) of the substrate 20.

The electromagnetic shield 40 is a conductive film, and covers the upper surface and side surface of the sealing material 30. The electromagnetic shield 40 is formed of a metal material such as Cu, Ni, Ti, Au, Ag, Pd, Pt, Fe, Cr, or SUS (stainless steel). Alternatively, the electromagnetic shield 40 may be formed of an alloy of two or more materials of the above described metal materials, or may be composed of a laminated film using two or more materials of the above described metal materials.

The electromagnetic shield 40 is electrically connected to a ground electrode 50 provided on a side surface of a package of the semiconductor device 10 (a side surface of the substrate 20) where the shield 40 material contacts the side surface of the wiring substrate 20. The electromagnetic shield 40 is provided to suppress electromagnetic energy waves generated inside the package of the semiconductor device 10 from leaking to the exterior of the package. That is, the electromagnetic shield 40 is provided for suppressing EMI in the area surrounding the semiconductor device 10. Also, in the use of the semiconductor device, the ground electrode 50 is electrically connected to an external ground through any one terminal 25 (a ground terminal).

In the semiconductor device 10 according to the present embodiment, the semiconductor package includes the substrate 20 and the sealing material 30, and on the outer edge of the semiconductor package on the wiring substrate (20) side, a step ST is formed. More specifically, as shown in FIG. 2B, the outer edge E20 of the wiring substrate 20 is located inwardly of the outer edge E30 of the sealing material 30. Therefore, the step ST is formed by the side surface of the substrate 20 and the side surface of the sealing material 30, and it extends around the perimeter of the semiconductor device 10.

As described above, since the step ST is formed on the outer edge of the semiconductor package on the substrate (20) side, when the semiconductor device 10 is mounted on the conveyance carrier 1, the step ST of the semiconductor device 10 and the surface of the conveyance carrier 1 form a trench TR which is open in a horizontal direction. Therefore, when the material forming the electromagnetic shield 40 is sputtered from one or more sputtering targets, the electromagnetic shield 40 material does not cover the inward extent of the trench TR.

A portion of the electromagnetic shield 40 material extends along the sides of the trench as shown in FIG. 2B. Therefore, the trench TR does not completely prevent the electromagnetic shield 40 material from entering the trench TR. However, between the wiring substrate 20 and the conveyance carrier 1, a continuous film of the electromagnetic shield 40 material is rarely formed, or is formed very thinly. For this reason, after the electromagnetic shield 40 is formed, when the semiconductor device 10 is lifted from the conveyance carrier 1, the occurrence of burrs caused by breaking of the electromagnetic shield 40 material when the semiconductor device is removed from the carrier 1 is suppressed.

Also, if the trench ST is deepened, it is possible to suppress the electromagnetic shield 40 material from reaching the base of the trench ST and thus suppress the occurrence of a continuous film of electromagnetic shield material extending between the semiconductor device 10 and the carrier 1. The depth of the trench ST may be controlled by reducing the size of the substrate 20 with respect to the span of the sealing material and/or by increasing the size of the sealing material 30.

As described above, in the semiconductor device 10 according to the present embodiment, since the step ST is formed on the outer edge of the semiconductor package on the substrate (20) side, during forming of the electromagnetic shield 40, it is possible to suppress formation of a continuous film of the electromagnetic shield 40 material from being formed on the side surface of the wiring substrate 20. Therefore, when the semiconductor device 10 is lifted from the conveyance carrier, it is possible to suppress occurrence of burrs on the outer edge of the semiconductor device 10.

Also, even if a gap is formed between the rear surface of the wiring substrate 20 and the surface of the conveyance carrier 1 due to distortion of the wiring substrate 20 or distortion of the conveyance carrier, the step ST suppresses the entry of the electromagnetic shield 40 material into the gap between the wiring substrate 20 and the conveyance carrier 1 where it could extend to the terminals 25. Therefore, according to the present embodiment, it is possible to suppress the terminals 25 from being short-circuited due to the material for the electromagnetic shields 40.

Also, protrusions for supporting the central portions of semiconductor packages on the conveyance carrier, and thereby forming the step ST and the trench TR, may be implemented. However, formation of the protrusions on the conveyance carrier increases the cost. Also, it is difficult to form the protrusions on the conveyance carrier such that the protrusions have heights equal to or lower than that of the wiring substrate 20. Further, it is also difficult to accurately position the semiconductor packages on the protrusions. Therefore, as compared to the case where the step ST and the trench TR are formed by forming the protrusions on the conveyance carrier, the step ST of the semiconductor device 10 according to the present embodiment is relatively easily formed as will be described below.

Figure 3:
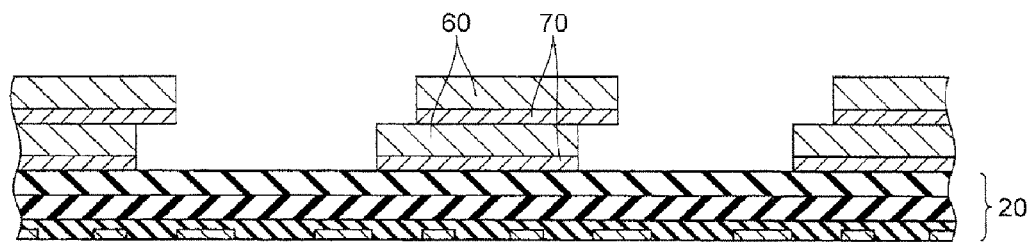
FIG. 3 is a cross-sectional view illustrating a step of a method of manufacturing the semiconductor device according to the first embodiment.
Figure 4:
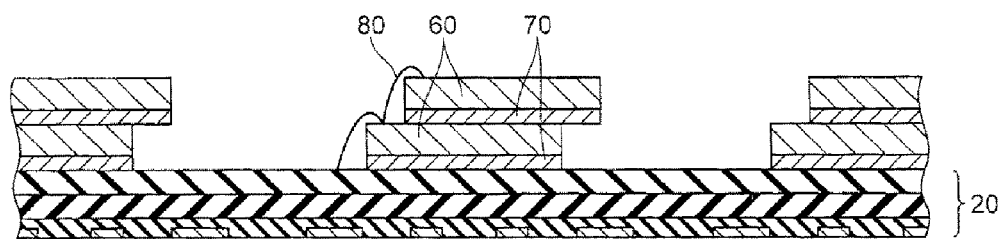
FIG. 4 is a cross-sectional view illustrating a step sequent to the step of FIG. 3 in the method of manufacturing the semiconductor device according to the first embodiment.
Figure 5:
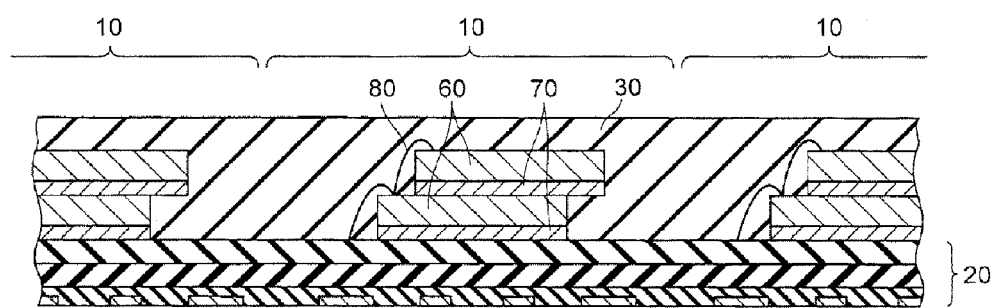
FIG. 5 is a cross-sectional view illustrating a step sequent to the step of FIG. 4 in the method of manufacturing the semiconductor device according to the first embodiment.
Figure 6:
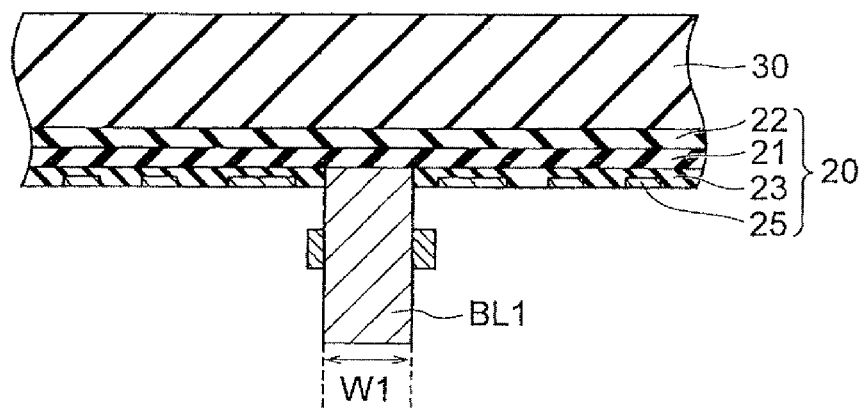
FIGS. 6(A) and 6(B) are views illustrating a dicing process for separating semiconductor packages from a larger substrate.
Figure 6:
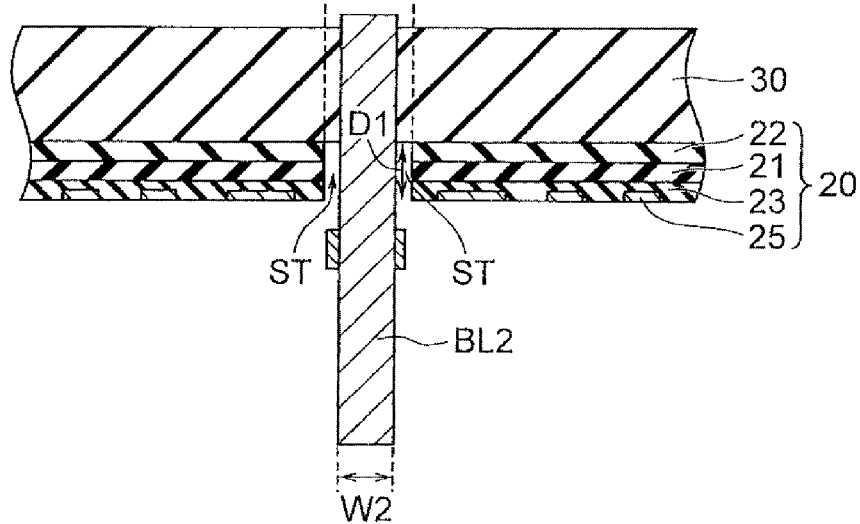
Figure 7:
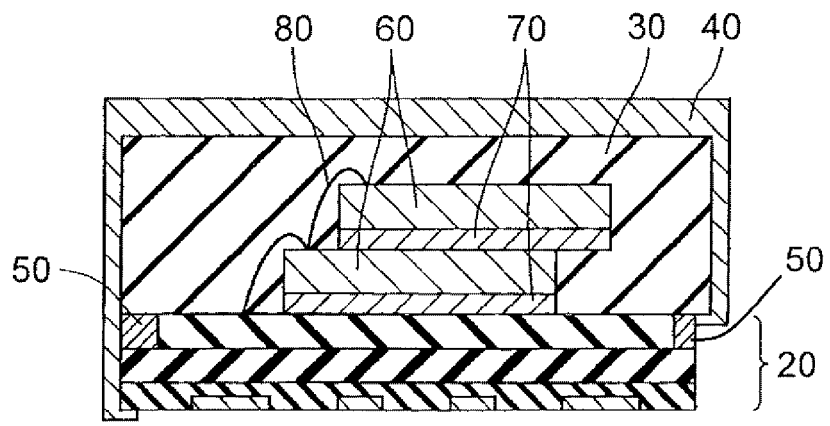
FIG. 7 is a view illustrating the semiconductor device after the electromagnetic shield has been formed.

FIGS. 3 to 7 are cross-sectional views illustrating a method of manufacturing the semiconductor device 10 according to the first embodiment. FIGS. 3 to 5 show processes up to a sealing process of forming the sealing material 30 of a resin. FIG. 6 shows a dicing process for separating the semiconductor packages. FIG. 7 shows the semiconductor device 10 after forming of the electromagnetic shield 40 thereon. Also, the processes shown in FIGS. 3 to 5 are processes before cutting or dicing of the wiring substrate to form individual packaged semiconductor devices. Therefore, the wiring substrate 20 connects the plurality of semiconductor packages to be later singulated. Although not illustrated, for example, a plurality of semiconductor packages to be later singulated are formed in a two-dimensional matrix on the wiring substrate 20.

First, as shown in FIG. 3, semiconductor chips 60 are mounted on the wiring substrate 20. At this time, the semiconductor chips 60 are bonded on the wiring substrate 20 by a die attaching material 70. The die attaching material 70 may be sheet-like or paste-like. In a case where the die attaching material 70 is a die attaching film with dicing tape, the dicing tape is stuck to a semiconductor wafer, and then dicing of the semiconductor wafer is performed. When a semiconductor chip 60 is singulated, the die attaching film remains on the rear surface of the semiconductor chip 60. Semiconductor chips 60 with the die attaching films are mounted on the wiring substrate 20. Other semiconductor chips 60 may be sequentially mounted on those semiconductor chips 60, thereby forming a stack of a plurality of semiconductor chips 60.

Meanwhile, in a case where die attaching paste is used as the die attaching material 70, it is required to apply the die attaching paste on the wiring substrate 20, and to mount the semiconductor chips 60 thereon. In order to stack the plurality of semiconductor chips 60, after a semiconductor chip 60 is mounted on the wiring substrate 20, the die attaching paste is applied to that semiconductor chip 60, and another semiconductor chip 60 is mounted. In this way, the structure shown in FIG. 3 may be obtained.

Next, in order to stabilize the bonding between the wiring substrate 20 and the semiconductor chips 60, and the bonding between the semiconductor chips 60, the wiring substrate 20 and the semiconductor chips 60 are thermally treated. Next, plasma cleaning is performed on the semiconductor chips 60, whereby the surfaces of the pads of the semiconductor chips 60 are cleaned. The plasma process is performed using Ar, $O_2$, $H_2$, a mixture of Ar and $H_2$, or the like.

Next, as shown in FIG. 4, wires 80 are attached such that the pads of the semiconductor chips 60 and the pads of the wiring substrate 20 are connected by the wires 80. The wires 80 are formed of, for example, Au, Ag, or Cu. Alternatively, the wires 80 may be Cu wires coated with Pd.

After plasma cleaning is performed, the semiconductor chips 60 and the wires 80 are sealed with a resin as shown in FIG. 5. The sealing method using the resin may be a transfer molding method, a compression molding method, a sheet molding method, an injection molding method, or the like.

Next, as shown in FIGS. 6(A) and 6(B), dicing of the wiring substrate 20 into individual semiconductor devices is performed. By dicing, the semiconductor packages 10 shown in FIG. 5 are separated from one another by use of blades BL1 and BL2.

During dicing, first, as shown FIG. 6 (A), cuts are made from the rear surface of the wiring substrate 20 (the opposite surface of the wiring substrate 20 to the mounted location of the semiconductor chips 60) by use of the first blade BL1 having a first width W1 (partial cutting). At this time, the depth D1 of the cuts (FIG. 6 (B)) may be substantially the same as the thickness of the wiring substrate 20. That is, the cuts may be made up to the interface between the wiring substrate 20 and the resin material 30 by use of the first blade BL1, such that the wiring substrate 20 is cut. Even if the wiring substrate 20 is cut, since the resin material 30 is continuous, the semiconductor packages are maintained in the connected state. As described above, trenches each having the first width W1 and the depth D1 are formed between each two of the plurality of semiconductor packages arranged in a two-dimensional matrix, by use of the first blade BL1.

Also, as long as it is possible to suppress the electromagnetic shield 40 material from entering the trenches TR, the depth D1 may be less than the thickness of the wiring substrate 20. On the contrary, there is a case where the depth D1 may larger than the thickness of the substrate 20. However, in this case, in order to suppress the material for the electromagnetic shields 40 from entering the trenches TR, it is not preferable that the depth D1 is excessively large.

Next, as shown in (B) of FIG. 6, the sealing material 30 is cut within the above described cuts by use of the second blade BL2 (full cutting). That is, the resin material 30 is cut within the trenches formed between the semiconductor packages 10 by the first blade BL1, by use of the second blade BL2. As a result, the plurality of semiconductor packages 10 are separated. In this case, the second blade BL2 has a second width W2 narrower than the first width W1. The second blade BL2 cuts the resin material 30 along the substantially central portions of the cuts formed by the first blade BL1. As a result, on the outer edge of each separated semiconductor package on the wiring substrate 20 side, the step ST is formed. That is, as shown in FIGS. 6(A) and 6(B), dicing is performed by use of the plurality of blades BL1 and BL2 having different widths, such that the semiconductor packages 10 are separated. As a result of making the first cut wider than the second cut, and forming the second cut generally in the center of the first cut, the step ST is formed on the outer edge of the rear surface of each singulated wiring substrate 20. Also, although not illustrated in FIGS. 6(A) and 6(B), by the dicing, the connection terminals 50 (see FIG. 2A) formed along the dicing lines of the substrate 20 are exposed. Each connection terminal 50 is electrically connected to a corresponding electromagnetic shield 40 (to be described below).

Next, in order to form the electromagnetic shields 40 on the surfaces of the semiconductor packages 10, the semiconductor packages 10 are mounted on the conveyance carrier 1 as shown in FIGS. 1A and 1B. Each semiconductor package 10 is mounted such that its surface on the substrate (20) side (the rear surface of the wiring substrate 20) faces the conveyance carrier 1.

Next, as shown in FIGS. 2A and 2B, the electromagnetic shields 40 are formed on the upper surfaces and side surfaces of the sealing materials 30 of the semiconductor packages 10. At this time, the electromagnetic shields 40 are formed by sputtering, vapor deposition, ion plating, or the like, so as to cover the upper surfaces and side surfaces of the semiconductor packages 10.

As an example of the electromagnetic shields 40, a laminated film of a Cu film and an SUS film may be considered. The SUS film is a protective film for suppressing corrosion of Cu. Also, it is preferable that the thickness of the Cu film should be, for example, 0.1 μm to 20 μm. In a case where the thickness of the Cu film is less than 0.1 μm, the electromagnetic shield effect weakens. Meanwhile, in a case where the thickness of the Cu film exceeds 20 μm, the Cu film may peel off the resin 30. Also, it is preferable that the film thickness of the SUS film should be 0.01 μm to 5 μm. In a case where the film thickness of the SUS film is less than 0.01 μm, the protective layer effect weakens. Meanwhile, in a case where the film thickness of the SUS film exceeds 5 μm, the SUS film may peel off the underlying Cu material. Further, since a large amount of SUS material is required for the thicker SUS film, the cost increases. Also, the protective layer is not limited to a metal film such as the SUS film, and may be a resin film, a ceramic film, a metal oxide film, a metal nitride film, or the like.

A large amount of electromagnetic noise is generated from the front surface of each semiconductor package. For this reason, it is preferable that the thickness of the electromagnetic shield 40 on the upper surface of the resin material 30 should be larger than the thickness of the electromagnetic shield 40 on the side surface of the sealing material 30. If the electromagnetic shield 40 on the upper surface of the resin material 30 is thick, it is possible to effectively suppress EMI.

Thereafter, the semiconductor packages 10 are taken out from the conveyance carrier 1, whereby the semiconductor devices 10 as shown in FIG. 2A are completed.

According to the present embodiment, on the outer edges of the semiconductor packages 10 on the wiring substrate (20) side, the steps ST are formed, respectively. Therefore, during sputtering of the material for the electromagnetic shields 40, since the steps ST of the semiconductor devices 10 and the surface of the conveyance carrier 1 form the trenches TR, and the trenches TR suppress the material for the electromagnetic shields 40 from entering toward the side surfaces of the wiring substrates 20. As a result, after the electromagnetic shields 40 are formed, when the semiconductor packages 10 are lifted from the conveyance carrier 1, occurrence of burrs on the electromagnetic shields 40 is suppressed.

The semiconductor packages 10 according to the present embodiment may be formed if there are two dicing blades with different widths, and may be implemented only by changing a dicing process. Therefore, the semiconductor packages 10 according to the present embodiment do not require forming of a conveyance carrier or tray having a special shape, and may be easily manufactured at low cost.

First Modification

Figure 8:
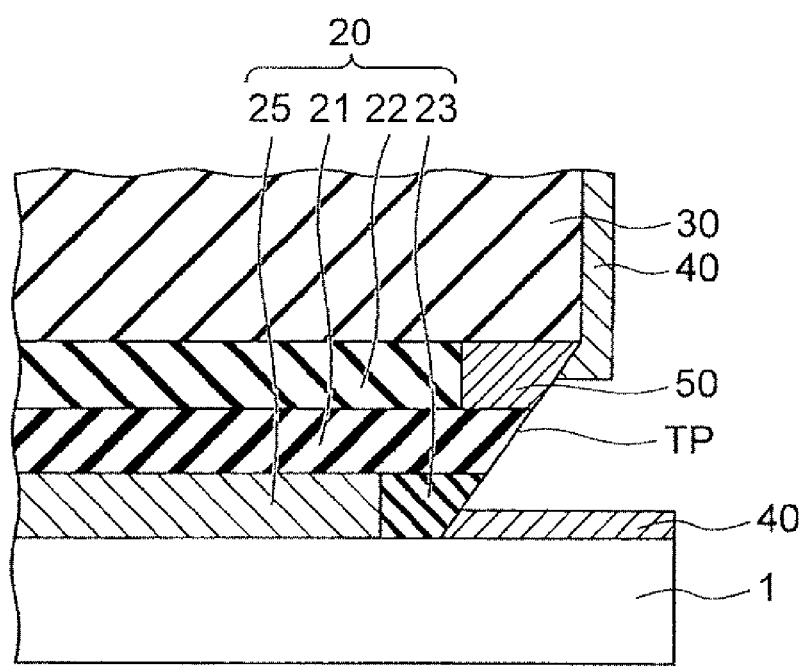
FIG. 8 is a cross-sectional view illustrating an example of a configuration of a semiconductor device according to a first modification of the first embodiment and a conveyance carrier.

FIG. 8 is a cross-sectional view illustrating an example of a configuration of a semiconductor device 10 according to a first modification of the first embodiment and a conveyance carrier 1. A wiring substrate 20 of the first modification is tapered (see a reference symbol "TP" of FIG. 8) such that the area of the chip mounting surface (a first surface) of the wiring substrate 20 is wider than the area of the rear surface (a second surface) of the wiring substrate 20. As described above, even in the case where the wiring substrate 20 is tapered from the upper surface toward the lower surface, it is difficult for the electromagnetic shield 40 material to be formed on the side surface of the wiring substrate 20. Therefore, the semiconductor device 10 according to the first modification may achieve the same effect as that of the first embodiment.

In order to taper the wiring substrate 20 from the upper surface toward the lower surface, the edge of the first blade BL1 described with reference to FIG. 6 (A) may be tapered. In this case, if dicing of the wiring substrates 20 is performed by use of the first blade BL1, the perimeter edge of each wiring substrate 20 is tapered from the upper surface to the lower surface thereof.

The other configuration according to the first modification and a manufacturing method according to the first modification may be the same as those according to the first embodiment. Therefore, the first modification may achieve the same effect as that of the first embodiment.

Second Modification

Figure 9:
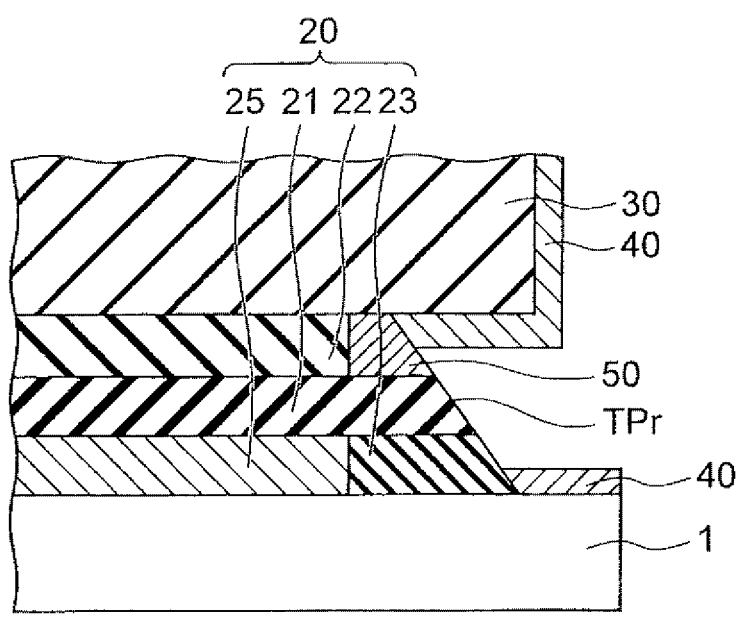
FIG. 9 is a cross-sectional view illustrating an example of a configuration of a semiconductor device according to a second modification of the first embodiment and a conveyance carrier.

FIG. 9 is a cross-sectional view illustrating an example of a configuration of a semiconductor device 10 according to a second modification of the first embodiment and a conveyance carrier 1. A wiring substrate 20 of the second modification is tapered (see a reference symbol "TPr" of FIG. 9) such that the area of the rear surface (a second surface) of the substrate 20 is wider than the area of the chip mounting surface (a first surface) of the wiring substrate 20. As described above, even in the case where the wiring substrate 20 is tapered from the lower surface toward the upper surface, it is difficult for the electromagnetic shield 40 material to be formed on the side surface of the wiring substrate 20. Therefore, the semiconductor device 10 according to the second modification may also achieve the same effect as that of the first embodiment.

In order to taper the wiring substrate 20 from the lower surface toward the upper surface, in the process described with reference to (A) of FIG. 6, the first blade BL1 may be slanted. Alternatively, after the process described with reference to (B) of FIG. 6, the side surface of the wiring substrate 20 may be cut from the transverse direction by use of another blade. In this way, the substrate 20 is tapered from the lower surface to the upper surface as shown in FIG. 9.

The other configuration according to the second modification and a manufacturing method according to the second modification may be the same as those according to the first embodiment. Therefore, the second modification may achieve the same effect as that of the first embodiment.

Second Embodiment

Figure 10A:
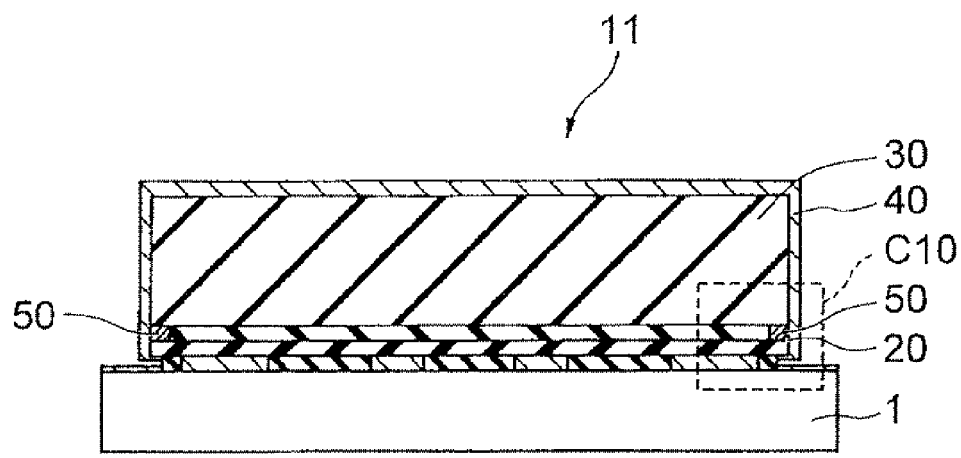
FIGS. 10A and 10B are views illustrating a state where an electromagnetic shield has been formed on the surface of a semiconductor device according to a second embodiment.
Figure 10B:
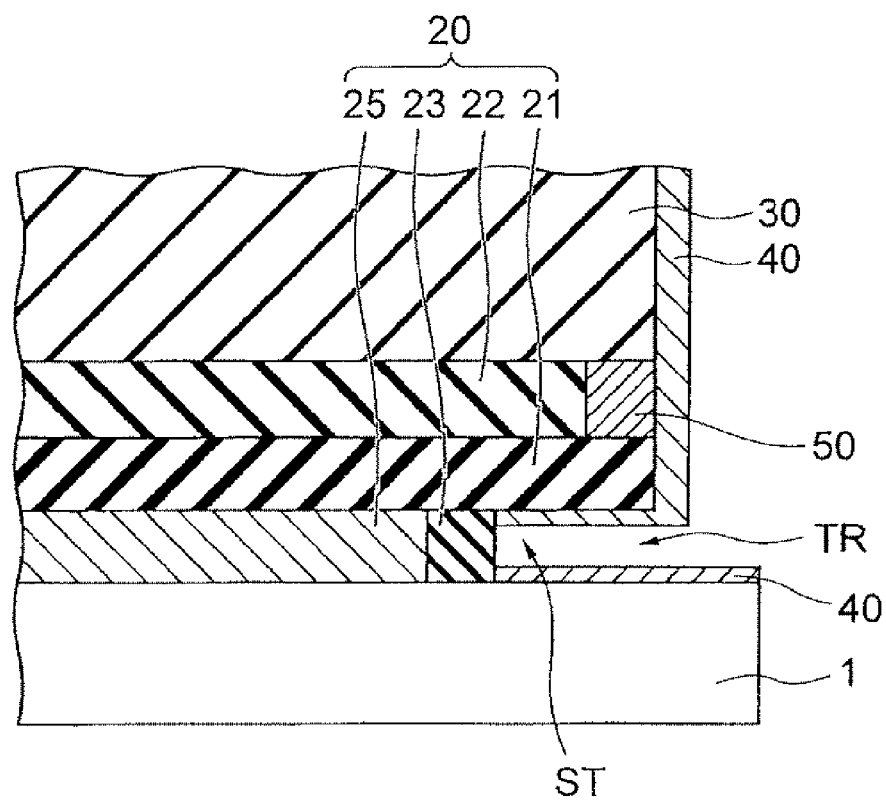

FIG. 10A is a view illustrating a state where an electromagnetic shield 40 has been formed on the surface of a semiconductor device 11 according to a second embodiment. FIG. 10B is an enlarged view of a portion of FIG. 10A shown within broken line portion C10. In the semiconductor device 11 according to the second embodiment, the solder resist layer 23 on the outer edge of the rear surface (a second surface) of the wiring substrate 20 is partially removed. Therefore, a step ST is formed by the solder resist layer 23 and the wiring substrate 20. That is, the core material 21 and the solder resist layer 22 extend to the outer edge of the sealing material 30, and the outer edge of the solder resist layer 23 is inwardly of the outer edge of the core material 21. The remainder of the configuration according to the second embodiment may be the same as that of the first embodiment.

Figure 11:
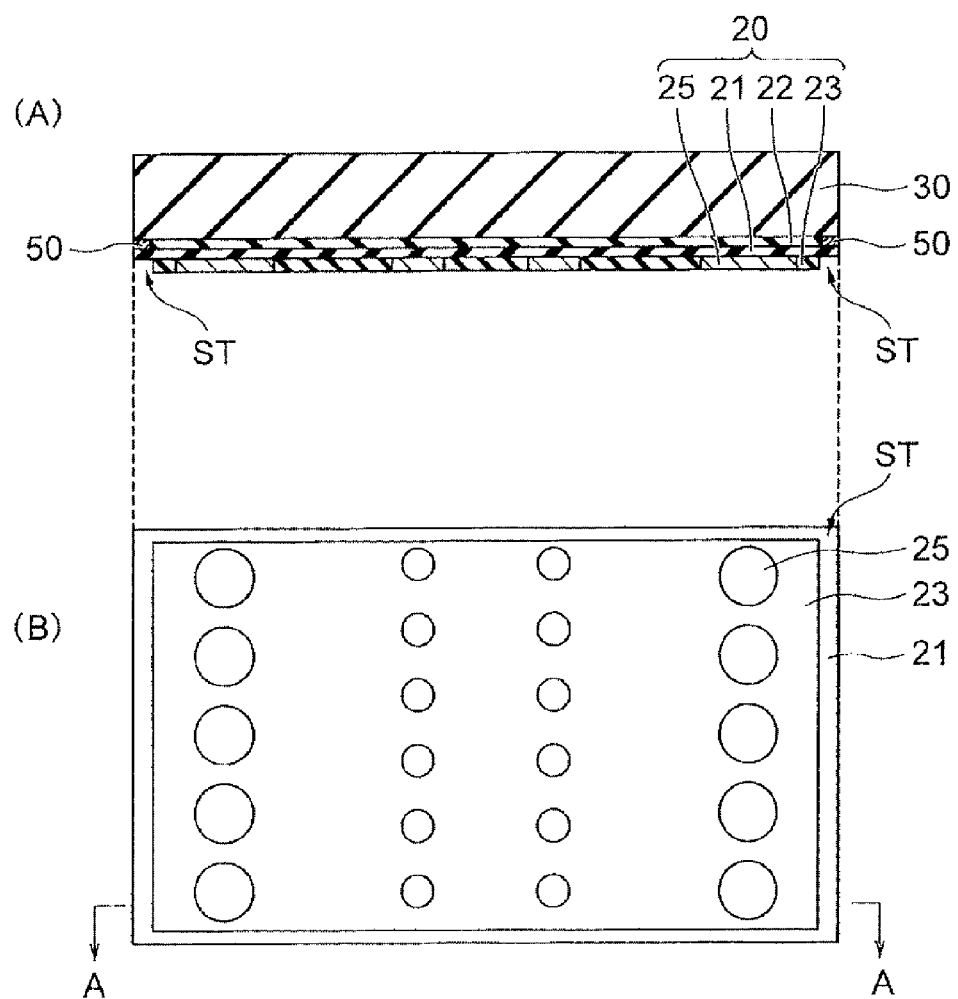
FIGS. 11(A) and 11(B) are views illustrating a cross section of the semiconductor device according to the second embodiment, and the rear surface of the semiconductor device.

FIG. 11 is a view illustrating a cross section of the semiconductor device 11 according to the second embodiment, and the rear surface of the semiconductor device 11. The cross section shown in (A) of FIG. 11 is taken along a line A-A of (B) of FIG. 11. Also, the semiconductor chip in the resin material 30 is not illustrated.

In the semiconductor device 11 according to the second embodiment, as shown in FIGS. 11 (A) and 11(B), on the outer periphery of the rear surface of the wiring substrate 20 of the semiconductor package, a step ST is formed. The step ST is formed at the interface of the core material 21 and the solder resist layer 23. Therefore, in the semiconductor device 11, the trench TR between the semiconductor package and the conveyance carrier 1 becomes extremely narrow as shown in FIG. 10B. Therefore, during forming of the electromagnetic shield 40, it is possible to further suppress the deposition of the material of the electromagnetic shields 40 within the trench TR, and it is possible to further suppress the formation of a continuous film of the electromagnetic shield 40 material on the side surface of the solder resist layer 23. As a result, it is possible to more effectively suppress occurrence of burrs on the outer edge of the semiconductor device 11 when the semiconductor device 11 is lifted from the conveyance carrier 1. Further, the semiconductor device 11 according to the second embodiment may achieve the same effect as that of the first embodiment.

The semiconductor device 11 requires processing to remove a portion of the solder resist layer 23 on the rear surface of the wiring substrate 20. For example, in the region shown in FIG. 11(B), the solder resist layer 23 may be removed by lithography. In this case, it is preferable that the solder resist layer 23 on the outer edge of the semiconductor package should be removed at the same time as removal of the solder resist layer 23 in the regions of the terminal 25. Also, in a case of forming the solder resist layer 23 by a printing method, it is not required to apply a material for the solder resist layer 23 on the outer edge of the semiconductor package. That is, the step ST according to the second embodiment may be formed by a lithography technology or a printing method during forming of the solder resist layer 23, without using a plurality of dicing blades. Therefore, the semiconductor device 11 according to the second embodiment may be more easily manufactured at low cost.

Alternatively, the step ST according to the second embodiment may be formed in a dicing process, similarly to the forming of the step ST of the first embodiment. For example, the depth D1 during partial cutting using the first blade BL1 shown in (A) of FIG. 6 may be set to be substantially equal to the thickness of the solder resist layer 23. In this case, it is possible to cut the solder resist layer 23 by use of the first blade BL1 while maintaining the core material 21 and the solder resist layer 22. If the depth D1 is set to be shallow as described above, it is possible to form the step ST according to the second embodiment in a dicing process.

Third Embodiment

Figure 12:
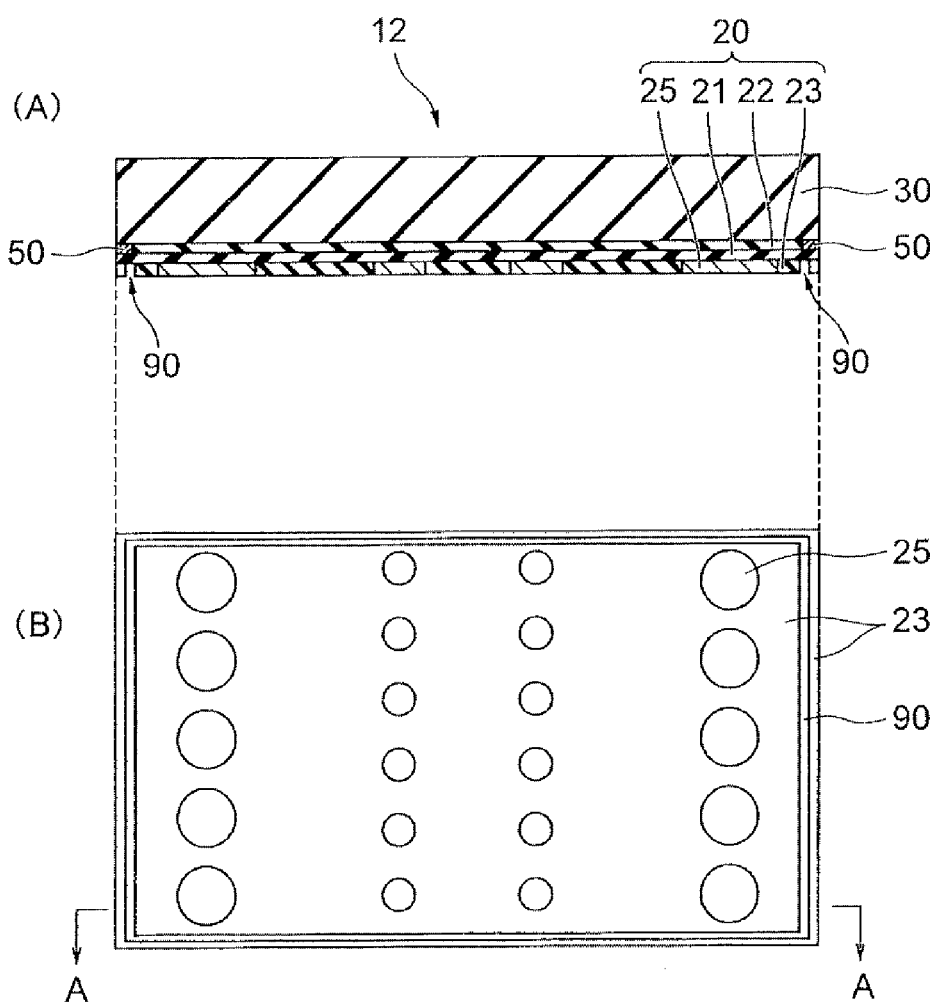
FIGS. 12(A) and 12(B) are views illustrating a cross section of a semiconductor device according to a third embodiment, and the rear surface of the semiconductor device.

FIG. 12 is a view illustrating a cross section of a semiconductor device 12 according to a third embodiment, and the rear surface of the semiconductor device 12. The cross section shown in (A) of FIG. 12 is taken along a line A-A of (B) of FIG. 12. As shown in (A) and (B) of FIG. 12, the semiconductor device 12 according to the third embodiment has an annular trench 90 formed along the outer periphery of the rear surface of a wiring substrate 20 of a semiconductor package. The trench 90 is formed by processing the solder resist layer 23 by lithography.

It is preferable that the trench 90 should be formed such that the distance between the trench 90 and the edge of the wiring substrate 20 is in a range from 10 μm to 500 μm. For example, in a case where the distance between the trench 90 and the edge of the wiring substrate 20 is less than 10 μm, it is difficult to accurately form the trench 90 by lithography. Meanwhile, if the distance between the trench 90 and the edge of the wiring substrate 20 exceeds 500 μm, the trench 90 overlaps the terminals 25.

Since the trench 90 is formed on the rear surface of the wiring substrate 20, it is possible to suppress the material for the electromagnetic shields 40 from extending inwardly of the rear surface during forming of the electromagnetic shield 40. For example, in a case where the wiring substrate 20 or a conveyance carrier 1 has been distorted, a gap is formed between the rear surface of the wiring substrate 20 and the surface of the conveyance carrier 1. If the material for the electromagnetic shields 40 enters that gap, the material will not extend inwardly of the underside of the substrate 20 beyond the trench 90. Therefore, the electromagnetic shield 40 material becomes trapped in the trench 90, thereby rarely reaching the terminals 25. Therefore, it is possible to suppress short circuiting of the terminals 25 adjacent to each through stray deposition of the shield material.

Meanwhile, the electromagnetic shield 40 covers the upper surface and side surface of the resin material 30, and covers the rear surface of the wiring substrate 20 up to a portion immediately before the trench 90. Therefore, the electromagnetic shield 40 may more effectively suppress EMI, and improve adhesion between the solder resist layer 23 and the core material 21.

Also, the shapes of the semiconductor chip 60 and the sealing material 30 are not especially limited. Although not illustrated, for example, the semiconductor chip 60 may be a shape having metal bumps. In this case, after dicing of the semiconductor wafer, a separate semiconductor chip 60 is mounted on the wiring substrate 20 by flip-chip mounting.

Next, between the semiconductor chip 60 and the wiring substrate 20, a resin is applied. Next, the semiconductor chip is covered with the sealing material 30. The subsequent processes may be the same as those of the above described embodiments. Therefore, if the semiconductor chip 60 has metal bumps, it is possible to obtain the effect of the above described embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   covering a plurality of semiconductor chips disposed on an upper surface of a substrate with a sealing material to form on the upper surface of the substrate a plurality of semiconductor packages to be singulated;
   cutting into a lower surface of the substrate to a first depth using a first blade having a first width to form cut regions having the first width;
   cutting the sealing material through the cut regions having the first width using a second blade having a second width narrower than the first width to singulate the semiconductor packages;
   after singulating the semiconductor packages, placing the plurality of semiconductor packages on a carrier such that a lower surface of the semiconductor packages face the carrier; and
   forming a conductive film on an upper surface and side surfaces of the sealing material on the semiconductor packages.

2. The method of claim 1, further comprising forming the conductive film layer on an upper surface of the carrier in locations adjacent to the semiconductor packages, wherein the conductive film formed on the upper surface of the carrier is discontinuous from the conductive film formed on the side surfaces of the sealing material on the semiconductor packages.

3. The method of claim 2, further comprising:
   forming a plurality of terminals on the lower surface of the substrate of a semiconductor package; and
   cutting a groove inwardly of the lower surface adjacent to, and inwardly of, the edge of the substrate of the semiconductor package.

4. The method of claim 1, further comprising, in the step of cutting into the lower surface of the substrate with the first blade, also cutting an interface material that is between the substrate and the sealing material.

5. The method of claim 1, wherein the substrate of the semiconductor packages after the cutting has a tapered side surface.

* * * * *